United States Patent [19]

Rolfson

[11] Patent Number: 5,786,027
[45] Date of Patent: Jul. 28, 1998

[54] METHOD FOR DEPOSITING POLYSILICON WITH DISCONTINUOUS GRAIN BOUNDARIES

[75] Inventor: J. Brett Rolfson, Boise, Id.

[73] Assignee: Micron Technology, Inc., Boise, Id.

[21] Appl. No.: 888,447

[22] Filed: Jul. 7, 1997

Related U.S. Application Data

[63] Continuation of Ser. No. 600,839, Feb. 14, 1996, abandoned.

[51] Int. Cl.$^6$ .................... C23C 16/24
[52] U.S. Cl. .................... 427/124; 427/255; 427/255.2; 427/255.7
[58] Field of Search .................... 427/124, 255, 427/255.2, 255.7

[56] References Cited

U.S. PATENT DOCUMENTS

| | | | |
|---|---|---|---|
| 5,110,757 | 5/1992 | Arst et al. | 437/89 |
| 5,135,607 | 8/1992 | Hirai | 156/643 |
| 5,231,056 | 7/1993 | Sandhu | 437/200 |
| 5,438,019 | 8/1995 | Sandhu | 437/101 |

FOREIGN PATENT DOCUMENTS

| | | |
|---|---|---|
| 61-264720 | 11/1986 | Japan. |
| 6168882 | 6/1994 | Japan. |

OTHER PUBLICATIONS

Ghandhi, Sorab K., *VLSI Fabrication Principles, Silicon and Gallium Arsenide*, Second Edition, pp. 537–539, 1994 (month unknown).

Wolf, S. and Rauber, R.N., *Silicon Processing for the VLSI Era, Vol. 1 Process Technology*, pp. 175–182, 1986 (month unknown).

Wu, T. H. Tom and Rosler, Richard S., "Properties of $WSi_x$ using dichloro–silane in a single wafer system", J. Vac. Sci. Technology, American Vacuum Society, pp. 1707–1713, Nov./Dec. 1988.

*Primary Examiner*—Michael Lusignan
*Assistant Examiner*—Timothy Meeks
*Attorney, Agent, or Firm*—Stephen A. Gratton

[57] ABSTRACT

A method for depositing a polysilicon layer on a substrate is provided. The method is performed in a LPCVD reaction chamber at a temperature of between 580° C. to 650° C. During the LPCVD process, at least two different silicon source gases, such as silane ($SiH_4$), disilane ($Si_2H_6$), trisilane ($Si_3H_8$) or dichlorosilane ($SiH_2Cl_2$) are absorbed onto the substrate to form random surface conditions. This grows the polysilicon layer with grain boundaries that are discontinuous and randomly oriented. The different silicon source gases can be injected into the reaction chamber at the same time or separately. In addition, a dopant gas such as phosphine ($PH_3$), arsine ($AsH_3$) or diborane ($B_2H_6$) can also be injected into the reaction chamber to dope the polysilicon layer in situ.

24 Claims, 1 Drawing Sheet

---

DEPOSITING A FIRST PORTION OF A POLYSILICON FILM USING A LPCVD PROCESS WITH A FIRST SILICON SOURCE GAS HAVING A FIRST STICKING COEFFICIENT.

↓

DEPOSITING A SECOND PORTION OF THE POLYSILICON FILM USING A SECOND SILICONE SOURCE GAS HAVING A SECOND STICKING COEFFICIENT TO CREATE A RANDOM SURFACE CONDITION AND FORM DISCONTINUOUS AND RANDOMLY ORIENTED GRAIN BOUNDARIES.

↓

OR ALTERNATELY

↓

COMBINING THE FIRST AND SECOND SILICON SOURCE GASES DURING THE LPCVD PROCESS TO CREATE A RANDOM SURFACE CONDITION AND FORM THE POLYSILICON FILM WITH DISCONTINUOUS AND RANDOMLY ORIENTED GRAIN BOUNDARIES.

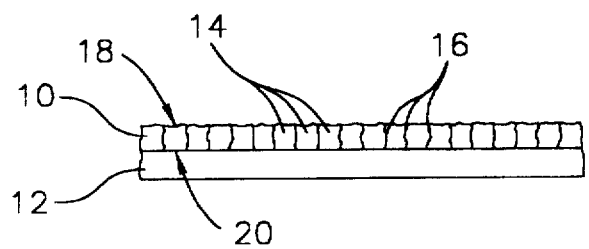

FIGURE 1

(PRIOR ART)

```
┌─────────────────────────────────────────────────────────────┐
│ DEPOSITING A FIRST PORTION OF A POLYSILICON FILM USING      │
│ A LPCVD PROCESS WITH A FIRST SILICON SOURCE GAS             │
│ HAVING A FIRST STICKING COEFFICIENT.                        │
└─────────────────────────────────────────────────────────────┘
                              │
┌─────────────────────────────────────────────────────────────┐
│ DEPOSITING A SECOND PORTION OF THE POLYSILICON FILM USING A │
│ SECOND SILICONE SOURCE GAS HAVING A SECOND STICKING         │
│ COEFFICIENT TO CREATE A RANDOM SURFACE CONDITION AND FORM   │
│ DISCONTINUOUS AND RANDOMLY ORIENTED GRAIN BOUNDARIES.       │
└─────────────────────────────────────────────────────────────┘
                              │                OR ALTERNATELY
┌─────────────────────────────────────────────────────────────┐
│ COMBINING THE FIRST AND SECOND SILICON SOURCE GASES         │
│ DURING THE LPCVD PROCESS TO CREATE A RANDOM                 │
│ SURFACE CONDITION AND FORM THE POLYSILICON FILM WITH        │
│ DISCONTINUOUS AND RANDOMLY ORIENTED GRAIN BOUNDARIES.       │
└─────────────────────────────────────────────────────────────┘
```

FIGURE 2

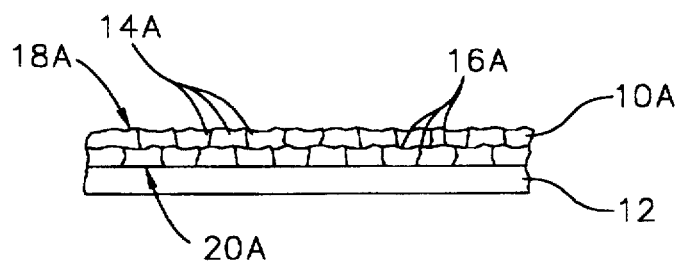

FIGURE 3

METHOD FOR DEPOSITING POLYSILICON WITH DISCONTINUOUS GRAIN BOUNDARIES

CROSS REFERENCE TO RELATED APPLICATIONS

This application is a continuation of application Ser. No. 08/600.839, filed Feb. 14, 1996, now abandoned.

FIELD OF THE INVENTION

This invention relates generally to semiconductor manufacture and specifically to an improved method for depositing a layer of polysilicon with discontinuous and randomly oriented grain boundaries.

BACKGROUND OF THE INVENTION

Thin films of polysilicon are widely used in semiconductor manufacture. Polysilicon is also known as polycrystalline silicon, poly-Si or simply poly. Common semiconductor devices which utilize polysilicon films include interconnects, gate electrodes, emitter structures and resistors. Polysilicon films can be undoped or doped with dopants such as boron, phosphorus and arsenic.

Polysilicon films are typically formed by chemical vapor deposition. One common deposition process is LPCVD (low pressure chemical vapor deposition) using silane ($SiH_4$) as a silicon source gas. With this process, film growth is performed at a temperature of about 625° C. to 675° C. and at a pressure of about 200 mTorr to 1 Torr. Doping can also be accomplished in the gas phase by introducing dopant gases such as diborane ($B_2H_6$), ($AsH_3$) arsine and ($PH_3$) phosphine.

The micro structures of polysilicon thin films include single crystal regions that are separated by grain boundaries. These single crystal regions are also known as grains (or crystallites) and are about 500 Å to 2500 Å across. The electrical and structural characteristics of the single crystal regions are very similar to bulk single crystal silicon. However, the grain boundaries have a profound effect on the electrical and structural characteristics of the bulk polysilicon film.

In particular, the grain boundaries inhibit the movement of free carriers through the polysilicon film and increase the resistivity of the film. In addition, the grain boundaries include many incomplete bonds which attract and trap dopant atoms. The size and orientation of the grain boundaries are determined by the temperature of the LPCVD deposition process, by dopant type and concentration, and by subsequent thermal processing of the polysilicon layer.

A typical doped polysilicon film includes grain boundaries that are on the order of about 5–10 Å wide. At LPCVD temperatures less than about 580° C., the as-deposited films are amorphous but can be subsequently recrystallized at 900°–1000° C. to form a polycrystalline structure. At LPCVD temperatures of about 625° C., the as-deposited films are polycrystalline with a fiber texture and a preferred grain orientation. The preferred grain orientation at 625° C. is along the {110} fiber axis. At temperatures of about 675° C., the preferred orientation is along the {100} fiber axis.

The grain boundaries in addition to affecting the electrical and structural characteristics of the film, can also react differently than the single crystal regions, during subsequent processing. One example occurs during doping of polysilicon. Doping can be by diffusion, ion implantation or in situ. Depending on the process, temperatures of about 600°–1000° C. can be reached during doping or diffusion of the dopant. These high temperatures can cause the grain boundaries to oxidize more rapidly than the single crystal regions.

For example, with diffusion doping using $PH_3$ and $O_2$ the grain boundaries can oxidize and form $P_2O_5$ glass. During a subsequent process, such as wet etching or cleaning, a wet chemical can strip the oxidized grain boundaries leaving the underlying substrate exposed. This is particularly a problem where the grain boundaries are continuous in the z-direction through the full thickness of the film. For example, at least some of the grain boundaries can extend continuously in the z-direction from the top surface of the film to the interface with an underlying substrate. Consequently when the grain boundaries are stripped by further processing, such as wet etching, the underlying substrate can also be exposed to the etchant.

The continuous grain boundaries can also increase the resistivity and affect the smoothness and structural integrity of the bulk film. Accordingly, it is sometimes advantageous to form polysilicon films with grain boundaries that are not continuous across the full thickness of the film and that have a random geometrical orientation. In addition, it is sometimes preferable to achieve this random grain polycrystalline structure at LPCVD temperatures of less than 650° C.

In view of the foregoing, it is an object of the present invention to provide an improved method for depositing polysilicon with discontinuous and randomly oriented grain boundaries. It is a further object of the present invention to provide an improved method for depositing polysilicon in which an underlying substrate is not in contact with continuous grain boundaries that can be easily stripped during subsequent processing. It is yet another object of the present invention to provide an improved method for depositing polysilicon with discontinuous and randomly oriented grain boundaries that is simple, efficient and compatible with volume semiconductor manufacture. Other objects, advantages and capabilities of the present invention will become more apparent as the description proceeds.

SUMMARY OF THE INVENTION

In accordance with the invention, a method for depositing a thin film of polysilicon with discontinuous and randomly oriented grain boundaries is provided. The method, simply stated, comprises a LPCVD process in which at least two silicon source gases having different adsorption characteristics (termed herein as "sticking coefficients") are used to grow a polysilicon thin film on a substrate. The different silicon source gases can be injected into a LPCVD reaction chamber at the same time or in a sequence. This method forms a polycrystalline film with grain boundaries that are not continuous across the full thickness of the film (i.e., not continuous in the z-direction). In addition, the grain boundaries will be randomly oriented with respect to the fiber axes of the film.

In an illustrative embodiment, a first silicon source comprises silane ($SiH_4$) and a second silicon source gas comprises disilane ($Si_2H_6$). These silicon source gases can be injected into the LPCVD reaction chamber at the same time, in a simple two step sequence (e.g., $SiH_4$—$Si_2H_6$), or in a pulsing sequence (e.g., $SiH_4$—$Si_2H_6$—$SiH_4$—$Si_2H_6$). Higher order silanes such as trisilane ($Si_3H_8$), and dichlorosilane ($SiH_2Cl_2$), can also be used in various combinations to grow the thin film with discontinuous and randomly oriented grain boundaries. In addition, more than two silicon source gases can be injected at the same time or in a sequence (e.g., $SiH_4$—$Si_2H_6$—$Si_3H_8$). Due to differences in the reactivity and adsorption characteristics of the silicon source gases, pressures and temperatures can be adjusted as required during the LPCVD deposition process to maintain a desired rate of deposition.

BRIEF DESCRIPTION OF THE DRAWINGS

FIG. 1 is an enlarged schematic cross sectional view of a thin film layer of polysilicon deposited in accordance with a prior art LPCVD deposition process with a continuous columnar grain structure;

FIG. 2 is a flow diagram outlining steps in the method of the invention; and

FIG. 3 is an enlarged schematic cross sectional vies of a thin film layer of polysilicon deposited in accordance with the invention with a discontinuous and random grain structure.

DETAILED DESCRIPTION OF THE PREFERRED EMBODIMENT

Referring to FIG. 1, a thin film polysilicon layer 10 deposited on a substrate 12 in accordance with a prior art LPCVD process is shown. The substrate 12 will typically be an insulator such as a gate oxide formed of $SiO_2$ or another dielectric. As another example, the substrate 12 can be monocrystalline silicon. The "as deposited" polysilicon layer 10 includes columnar grains 14 separated by grain boundaries 16. This grain structure is also referred to in the art as a fiber texture.

During LPCVD, the structural characteristics of the polysilicon layer 10 are a function of the deposition temperature. The columnar grain structure of the polysilicon layer 10 shown in FIG. 1 occurs at a LPCVD temperature of about 625° C. At this temperature the preferred orientation of the grain boundaries 16 is along the {110} fiber axis. At LPCVD temperatures of about 675° C., the preferred grain orientation is along the {100} fiber axis (not shown).

In the polycrystalline structure shown in FIG. 1, the grain boundaries 16 are continuous in the z-direction and extend through the full thickness of the polysilicon layer 10. In other words, the grain boundaries 16 are continuous from the surface 18 of the polysilicon layer 10 to the interface 20 of the polysilicon layer 10 with the substrate 12.

With a columnar grain structure, the grain boundaries 16 can react differently than the grains 14 during subsequent processing and affect the underlying substrate 12. For example, oxidation can occur along the grain boundaries 16 but not within the grains 14. When wet chemicals, such as HF acid, are used to clean or etch the polysilicon layer 10, the oxidized grain boundaries 16 can be stripped leaving the substrate 12 exposed. This can cause the substrate 12 to be attacked and damaged by the wet chemical.

Referring to FIG. 2, steps in a method for forming a polysilicon film 10A (FIG. 3) with discontinuous and randomly oriented grain boundaries 16A (FIG. 3)are shown. The method, broadly stated, comprises the steps of:

A. Depositing a first portion of a polysilicon film using a LPCVD process with a first silicon source gas having a first sticking coefficient; and then B. Depositing a second portion of the polysilicon film using a second silicon source gas having a second sticking coefficient to create a random surface condition and form discontinuous and randomly oriented grain boundaries.

Alternately the method of the invention comprises:

C. Combining the first and second silicon source gases during the LPCVD process to create a random surface condition and form the polysilicon film with discontinuous and randomly oriented grain boundaries.

The LPCVD process can be carried out in a standard LPCVD furnace at temperatures of from 580° C. to 650° C. and at pressures of from about 200 mTorr to 1 Torr. In accordance with the invention different silicon source gases are injected into the process chamber either sequentially (steps A and B) or simultaneously (step C). Suitable silicon source gases include silane ($SiH_4$), disilane ($Si_2H_6$), trisilane ($Si_3H_8$) and dichlorosilane ($SiH_2Cl_2$).

In addition to a simple two step deposition sequence as outlined in FIG. 2, the different silicon source gases can be injected in a pulsing sequence (e.g., $SiH_4$—$Si_2H_6$—$SiH_4$—$Si_2H_6$). Furthermore, more than two silicon source gases can be injected at the same time or in various sequences.

In general, the silicon source gases will decompose within the reaction chamber and will be adsorbed onto a deposition site on the substrate 12. For example, the overall reaction for silane can be characterized by the formula: $SiH_4$ (vapor)=Si (solid)+$2H_2$ (gas).

The different silicon source gases will have different surface adsorption characteristics during the LPCVD deposition process. This adsorption characteristic is termed herein as "a sticking coefficient". The sticking coefficient is not precisely quantifiable but will be different for each of the above cited silicon source gases. By using multiple silicon source gases with different sticking coefficients, a more random surface condition is present during the deposition process. This leads to the grains forming with discontinuous and randomly oriented grain boundaries.

In addition to the silicon source gases, various dopant gases ($PH_3$, $AsH_3$, $B_2H_6$) can be injected into the process chamber for doping the "as deposited" layer. Additionally, inert carrier gases (e.g., Ar, $N_2$, He) can be injected into the process chamber to maintain desired flow rates and concentrations for the silicon source gases and dopant gases.

An exemplary sequential process can begin with silane ($SiH_4$) as a silicon source gas and then switch to disilane ($Si_2H_6$), trisilane ($Si_3H_8$) or dichlorosilane ($SiH_2Cl_2$) as a silicon source gas. As is apparent, various other combinations are possible. During the LPCVD process temperatures and pressures can be varied to maintain desired deposition rates for the different silicon source gases.

An exemplary simultaneous process can combine silane ($SiH_4$) with disilane ($Si_2H_6$), trisilane ($Si_3H_8$) or dichlorosilane ($SiH_2Cl_2$). With a simultaneous deposition process, the two different silicon source gases are injected into the process chamber at the same time. As with the sequential process, the flow rates and ratio of the different gases can be selected to achieve a random surface condition during the LPCVD process.

FIG. 3 illustrates a polysilicon layer 10A deposited on the substrate 12 in accordance with the above outlined method. The polysilicon layer 10A includes grains 14A and grain boundaries 16A. The grain boundaries 16A are not continuous in the z-direction from the surface 18A of the polysilicon layer 10A to the interface 20A with the substrate 12. Rather, the grain boundaries 16A are discontinuous across the thickness of the polysilicon layer 10A. In addition, the grain boundaries 16A do not follow a particular orientation of the fiber axes of the polysilicon layer 10A. Rather, the grain boundaries 16A are randomly oriented with respect to the {110} and {100} fiber axes. With a random grain orientation, in a subsequent process, such as cleaning or wet etching, it is less likely the that the substrate 12 will be left exposed by stripping of the grain boundaries 16A.

The polysilicon layer 10A can also be doped during the LPCVD process by injecting dopant gases into the reaction chamber. Representative dopant gases can include phosphine ($PH_3$), arsine ($AsH_3$) and diborane ($B_2H_6$). The dopant gas can be flowed concurrently with the different silicon source gases or separately with a subsequent thermal anneal. In addition, flow rates for the dopant gases can be varied depending on the desired concentration of dopants and the desired deposition rate.

Example

In this example, disilane ($Si_2H_6$) can be used in a sequential LPCVD process with silane ($SiH_4$) to deposit a doped polysilicon layer with discontinuous and randomly oriented grain boundaries. A suitable LPCVD furnace is manufactured by ASM Europe, Netherlands and is designated an Advance 400 model. The push, temperature ramp, stabilization steps and pump/purge cycles can be according to standard procedures. The deposition temperature can be about 590° C. and the deposition pressure can be about 300 mTorr. Initially, silane ($SiH_4$) can be injected into the reaction chamber at a flow rate of about 200 sccm. At the same time phosphine ($PH_3$) can be injected into the reaction chamber at a flow rate of about 100 sccm. After a time period of from 5–15 minutes, the flow of silane ($SiH_4$) can be stopped and disilane ($Si_2H_6$) can be injected into the reaction chamber at a flow rate of about 100 sccm. The flow of the disilane ($Si_2H_6$) can be continued for a time period of about 10 to 30 minutes to form the polysilicon layer with a thickness of from 1000 Å to 2500 Å.

Example

At the same temperature and pressure as the first example, silane ($SiH_4$) and disilane ($Si_2H_6$) can be simultaneously injected into the reaction chamber at flow rates of 200 sccm and 100 sccm respectively for a time period of from 10–20 minutes.

Example

At the same temperature and pressure as the first example, silane ($SiH_4$) and disilane ($Si_2H_6$) can be injected in an alternating pulsing sequence (e.g., $SiH_4$—$Si_2H_6$—$SiH_4$—$Si_2H_6$). In this case the alternating gas pulses can be 2–3 minutes in duration for a total time period of from 10–20 minutes.

Example

At the same temperature and pressure as the first example, silane ($SiH_4$), disilane ($Si_2H_6$) and dichlorosilane ($SiH_2Cl_2$) can be injected in a sequence (e.g., $SiH_4$—$Si_2H_6$—$SiH_2Cl_2$). In this case the sequential gas pulses can be 2–3 minutes in duration for a total time period of from 10–20 minutes.

Example

In this example, silane ($SiH_4$) can be used in a sequential LPCVD process with dichlorosilane ($SiH_2Cl_2$) to deposit a doped polysilicon layer with discontinuous and randomly oriented grain boundaries. During the deposition process, temperatures and pressures can be adjusted to accommodate the different silicon source gases. At a deposition temperature of 625° C. and a pressure of 500 mTorr, a flow rate of 200 sccm of silane ($SiH_4$) can be maintained for from 5 minutes to 15 minutes. The flow of silane can then be stopped and the dichlorosilane ($SiH_2Cl_2$) can be flowed at a flow rate of 150 sccm for from 10 minutes to 30 minutes. With dichlorosilane ($SiH_2Cl_2$) as a silicon source gas the deposition temperature can be 650° C. and the deposition pressure can be 400 mTorr.

While the invention has been described with reference to certain preferred embodiments, as will be apparent to those skilled in the art, certain changes and modifications can be made without departing from the scope of the invention as defined by the following claims.

I claim:

1. A method for depositing a polysilicon film on a substrate comprising:

providing a low pressure chemical vapor deposit ion (LPCVD) apparatus having a reaction chamber;

placing the substrate into the reaction chamber;

heating the reaction chamber to a temperature of from 580° C. to 650° C.;

evacuating the reaction chamber to a pressure of from 200 mTorr to 1 Torr;

injecting a first silicon source gas at a first flow rate and a second silicon source gas at a second flow rate into the reaction chamber, said first silicon source gas having a different adsorption characteristic than said second silicon source gas; and forming polysilicon grains on the substrate, said grains including grain boundaries having a random orientation in which the grain boundaries are not continuous from a surface of the polysilicon film to the substrate.

2. The method as claimed in claim 1 wherein the injecting step is performed for a time period sufficient to form the layer with a thickness of about 1000 Å to 2500 Å.

3. The method as claimed in claim 1 wherein the first and second silicon source gases comprise a gas independently selected from the group consisting of silane ($SiH_4$), disilane ($Si_2H_6$), trisilane ($Si_3H_8$) and dichlorosilane ($SiH_2Cl_2$).

4. The method as claimed in claim 1 wherein the substrate comprises a material selected from the group consisting of silicon and silicon dioxide.

5. The method as claimed in claim 1 wherein the substrate comprises silicon with a dielectric layer thereon.

6. The method as claimed in claim 1 further comprising injecting a third silicon source gas into the reaction chamber, said third silicon source gas having a different adsorption characteristic than said first and second silicon source gases, said first, second and third silicon sources cases injected at a same time.

7. A method for depositing a polysilicon film on a substrate comprising:

providing a low pressure chemical vapor deposition (LPCVD) apparatus having a reaction chamber;

placing the substrate into the reaction chamber;

heating the reaction chamber to a temperature of from 580° C. to 650° C.;

evacuating the reaction chamber to a pressure of from 200 mTorr to 1 Torr;

injecting a first silicon source gas into the reaction chamber at a first flow rate for absorption onto the substrate;

injecting a second silicon source gas into the reaction chamber at a second flow rate for absorption onto the substrate;

said first and second silicon source gases having different absorption characteristics; and forming polysilicon grains on the substrate, said grains including grain boundaries having a random orientation in which the grain boundaries do not extend from a surface of the polysilicon film to the substrate.

8. The method as claimed in claim 7 wherein the injecting step is performed for a time period sufficient to form the layer with a thickness of about 1000 Å to 2500 Å.

9. The method as claimed in claim 7 wherein the substrate comprises silicon with a dielectric layer thereon.

10. The method as claimed in claim 7 wherein the first and second silicon source gases comprise a gas selected independently from the group consisting of silane ($SiH_4$), disilane ($Si_2H_6$), trisilane ($Si_3H_8$) and dichlorosilane ($SiH_2Cl_2$).

11. The method as claimed in claim 7 wherein the first silicon source gas comprises silane ($SiH_4$) and the second silicon source gas comprises a gas selected from the group consisting of disilane ($Si_2H_6$), trisilane ($Si_3H_8$) and dichlorosilane ($SiH_2Cl_2$).

12. The method as claimed in claim 7 further comprising injecting a third silicon source gas into the reaction chamber during injecting of the first or second silicon source gas.

13. The method as claimed in claim 7 further comprising injecting a dopant gas into the reaction chamber during injecting of the first or second silicon source gas, the dopant gas comprising a gas selected from the group consisting of phosphine ($PH_3$), arsine ($AsH_3$) and diborane ($B_2H_6$).

14. The method as claimed in claim 7 wherein the first and second flow rates are substantially equal.

15. The method as claimed in claim 7 further comprising injecting a third and a fourth silicon source gas into the reaction chamber, said third and fourth silicon source gases having different adsorption characteristics than said first and second silicon source gases.

16. A method for depositing a polysilicon film comprising:

providing a substrate comprising a material selected from the group consisting of silicon and silicon dioxide;

providing a low pressure chemical vapor deposition (LPCVD) apparatus having a reaction chamber;

placing the substrate into the reaction chamber;

heating the reaction chamber to a temperature of from 580° C. to 650° C.;

evacuating the reaction chamber to a pressure of from 200 mTorr to 1 Torr;

injecting a first silicon source gas into the reaction chamber at a first flow rate;

injecting a second silicon source gas into the reaction chamber at a second flow rate, said first and second silicon source gases having a different adsorption characteristic;

injecting a dopant gas into the reaction chamber at a third flow rate during injecting of the first or second silicon source gas; and forming polysilicon grains on the substrate, said grains including grain boundaries having a random orientation in which the grain boundaries are not continuous from a surface of the polysilicon film to the substrate.

17. The method as claimed in claim 16 wherein the first and second silicon source gases comprise gases selected independently from the group consisting of silane ($SiH_4$), disilane ($Si_2H_6$), trisilane ($Si_3H_8$) and dichlorosilane ($SiH_2Cl_2$).

18. The method as claimed in claim 16 wherein the dopant gas comprises a gas selected from the group consisting of phosphine ($PH_3$), arsine ($AsH_3$) and diborane ($B_2H_6$).

19. The method as claimed in claim 16 wherein the layer has a thickness between about 1000 Å to 2500 Å.

20. The method as claimed in claim 16 wherein the first flow rate is about 200 sccm and the second and third flow rates are about 100 sccm.

21. A method for depositing a polysilicon film on a substrate comprising:

providing a low pressure chemical vapor deposition (LPCVD) apparatus having a reaction chamber;

placing the substrate into the reaction chamber;

heating the reaction chamber to a temperature of from 580° C. to 650° C.;

evacuating the reaction chamber to a pressure of from 200 mTorr to 1 Torr;

injecting a first and a second silicon source gas into the reaction chamber at a same time;

said first and second silicon source gases having a different absorption coefficient on the substrate; and injecting a dopant gas into the reaction chamber; and forming polysilicon grains on the substrate, said grains including grain boundaries having a random orientation in which the grain boundaries are not continuous from a surface of the polysilicon film to the substrate.

22. The method as claimed in claim 21 wherein the first and second silicon source gases comprise a gas selected independently from the group consisting of silane ($SiH_4$), disilane ($Si_2H_6$), trisilane ($Si_3H_8$) and dichlorosilane ($SiH_2Cl_2$).

23. The method as claimed in claim 21 wherein a flow rate of the first silicon source gas is different than a flow rate of the second silicon source gas.

24. The method as claimed in claim 21 the dopant gas comprises a gas selected from the group consisting of phosphine ($PH_3$), arsine ($AsH_3$) and diborane ($B_2H_6$).

* * * * *